United States Patent [19]

Noro

[11] Patent Number: 5,742,245

[45] Date of Patent: Apr. 21, 1998

[54] DIGITAL-TO-ANALOG CONVERTER CIRCUIT USING CURRENT MIRROR CIRCUIT FOR CONVERSION OF LAW-ORDER BITS

[75] Inventor: Masao Noro, Hamamatsu, Japan

[73] Assignee: Yamaha Corporation, Hamamatsu, Japan

[21] Appl. No.: 644,645

[22] Filed: May 7, 1996

[30] Foreign Application Priority Data

May 8, 1995 [JP] Japan .................... 7-134833

[51] Int. Cl.$^6$ .................................... H03M 1/66
[52] U.S. Cl. .................. 341/144; 341/131; 341/135; 341/145; 341/150
[58] Field of Search ..................... 341/131, 135, 341/144, 145, 150

[56] References Cited

U.S. PATENT DOCUMENTS

| | | | |
|---|---|---|---|
| 4,408,190 | 10/1983 | Nagano | 340/347 DA |
| 4,410,879 | 10/1983 | Gumm et al. | 340/347 DA |
| 5,294,927 | 3/1994 | Levinson et al. | 341/141 |
| 5,361,068 | 11/1994 | Llewellyn | 341/144 |
| 5,483,150 | 1/1996 | Elliott et al. | 323/312 |

Primary Examiner—Jeffrey A. Gaffin
Assistant Examiner—Jason L. W. Kost
Attorney, Agent, or Firm—Pillsbury Madison & Sutro LLP

[57] ABSTRACT

A digital-to-analog converter circuit is configured by a digital-to-analog converter receiving data of m bits (where 'm' is an integer arbitrarily selected), a voltage-follower circuit containing an operational amplifier, a current-mirror circuit and a current-switching circuit. Herein, the data of m bits are extended by bits $b_H$ and $b_L$ in low-order positions thereof, wherein $b_H$ is placed in a higher order than $b_L$. A noninverting input of the operational amplifier is connected to an output of the digital-to-analog converter; and a feedback resistor is connected between an inverting input and an output of the operational amplifier. The current-mirror circuit, using MOS transistors, provides two constant currents $I_H$ and $I_L$ in response to the bits $b_H$ and $b_L$ respectively, wherein a relationship between the constant currents $I_H$ and $I_L$ is defined by an equation of $I_H=2 \times I_L$. The current-switching circuit, which is connected between the current-mirror circuit and the voltage-follower circuit, is designed to selectively switch the two constant currents to be supplied to the inverting input of the operational amplifier in accordance with values of the bits $b_H$ and $b_L$. Thanks to the configuration of the digital-to-analog converter circuit, the feedback resistor and the current-mirror circuit can be designed for small areas. Hence, it is possible to easily extend a number of bits without greatly enlarging the size of the digital-to-analog circuit.

5 Claims, 1 Drawing Sheet

1

DIGITAL-TO-ANALOG CONVERTER CIRCUIT USING CURRENT MIRROR CIRCUIT FOR CONVERSION OF LAW-ORDER BITS

BACKGROUND OF THE INVENTION

The invention relates to digital-to-analog converter circuits which convert digital signals to analog signals.

One type of digital-to-analog converter circuit (hereinafter, simply referred to as D/A converter circuit) is designed to provide a large number of bits, wherein the D/A converter circuit is configured with a combination of resistor strings and CMOS transistors. Herein, a resistor-string-type D/A converter provides high output impedance; hence, there should be provided a high-input-impedance circuit to receive an output of the D/A converter. For this reason, the D/A converter is followed by a voltage-follower circuit using an operational amplifier.

The aforementioned D/A converter circuit is advantageous in that a high precision of conversion can be obtained. However, the D/A converter circuit has the following disadvantage:

If the number of bits inputted to the D/A converter circuit is increased (or extended), the number of resistors should be correspondingly increased. So, if the D/A converter circuit is manufactured as an integrated circuit (IC or ICs, the IC will have a relatively large size because the resistors require relatively large areas.

SUMMARY OF THE INVENTION

It is an object of the invention to provide a D/A converter circuit which is capable of easily increasing the number of bits, inputted thereto, without enlarging the size of the IC.

A digital-to-analog converter circuit of the invention is configured by a digital-to-analog converter, a voltage-follower circuit, a current-mirror circuit and a current-switching circuit. Herein, the digital-to-analog converter receives data of m bits, wherein the data of m bits are extended by bits $b_H$ and $b_L$ in low-order positions thereof; and $b_H$ is placed in a higher order than $b_L$. The voltage-follower circuit contains an operational amplifier whose noninverting input is connected to an output of the digital-to-analog converter, wherein a feedback resistor is connected between an inverting input and an output of the operational amplifier. The current-mirror circuit, using MOS transistors, provides two constant currents $I_H$ and $I_L$ in response to the bits $b_H$ and $b_L$ respectively, wherein a relationship between the constant currents $I_H$ and $I_L$ is defined by an equation of $I_H=2\times I_L$. The current-switching circuit, which is connected between the current-mirror circuit and the voltage-follower circuit, is designed to selectively switch over the two constant currents to be supplied to the inverting input of the operational amplifier in accordance with values of the bits $b_H$ and $b_L$.

The voltage-follower circuit performs addition of currents so as to produce an analog output voltage which corresponds to extended low-order bits (i.e., $b_H$ and $b_L$), wherein such an analog output voltage is relatively small. Therefore, it is possible to reduce amounts of the constant currents generated by the current-mirror circuit. In addition, small resistance can be applied to the feedback resistor. Thus, it is easily possible to extend the number of bits without greatly enlarging the size of the digital-to-analog circuit.

BRIEF DESCRIPTION OF THE DRAWING

These and other objects of the subject invention will become more fully apparent as the following description is read in light of the attached drawing wherein.

DESCRIPTION OF THE PREFERRED EMBODIMENT

Figure 1:
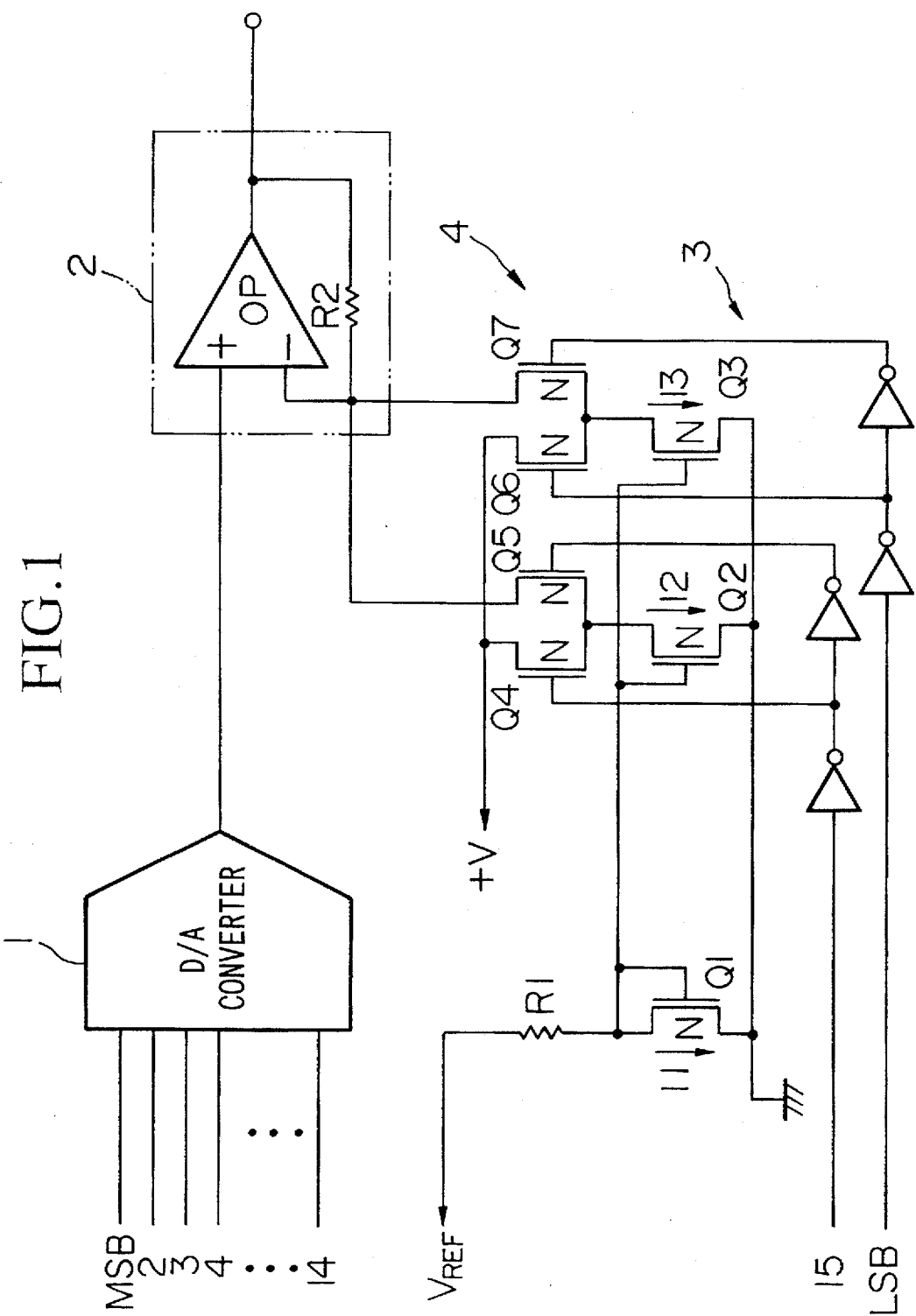
FIG. 1 is a circuit diagram showing a configuration of a D/A converter circuit which is designed in accordance with an embodiment of the invention.

FIG. 1 is a circuit diagram showing a configuration of a D/A converter circuit which is designed in accordance with an embodiment of the invention.

The D/A converter circuit of FIG. 1 contains a D/A converter 1, a voltage-follower circuit 2 and a current-mirror circuit 3. Herein, the D/A converter 1 receives 14-bit data which are placed in high orders of 16-bit data; and the voltage-follower circuit 2 receives an output of the D/A converter 1. The current-mirror circuit 3 generates constant currents in response to 2-bit data which are placed in low orders of the 16-bit data. The D/A converter circuit 1 is designed as a resistor-string-type D/A converter using COMS circuits. A current-switching circuit 4 is provided to switch over connection between the voltage-follower circuit 2 and the current-mirror circuit 3. An output of the current-mirror circuit 3 is supplied to the voltage-follower circuit 2 through the current-switching circuit 4, so that the output of the current-mirror circuit 3 is added to the output of the D/A converter 1.

The voltage-follower circuit 2 is configured using an operational amplifier OP. The output of the D/A converter 1 is supplied to a noninverting input (+) of the operational amplifier OP. A feedback resistor R2 is connected between an inverting input (−) and an output of the operational amplifier OP. The voltage-follower circuit 2 receives output voltage of the D/A converter 1 by high input impedance thereof, so that the output voltage of the D/A converter 1 is directly provided as the output of the voltage-follower circuit 2. In short, the voltage-follower circuit 2 serves as a noninverting amplifier having a feedback gain of '1'.

The current-mirror circuit 3 is configured using 'N-channel NMOS'(NMOS) transistors. Herein, a transistor Q1 and a resistor R1 are combined to produce a reference current I1. The reference current I1 is subjected to current-mirror operation, so that transistors Q2 and Q3 (or $Q_H$ and $Q_L$) generate constant currents I2 and I3 (or $I_H$ and $I_L$) respectively. The constant current I2 is related to a fifteenth bit ($b_H$), a number of which is counted from a MSB of the 16-bit data, whilst the constant current I3 is related to a LSB (i.e., sixteenth bit; $b_L$) of the 16-bit data. Measurements of the transistors Q2 and Q3 are determined to establish a relationship between the constant currents I2 and I3, as follows:

$$I2=2\times I3$$

The current-switching circuit 4 is configured by two pairs of transistors (i.e., Q4, Q5 and Q6, Q7) which correspond to low- order 2 bits which are extended with respect to the 14-bit data inputted to the D/A converter 1. The current-switching circuit 4 switches over current paths for the constant currents I2 and I3 in response to 1s and 0s of the low-order 2 bits. The constant current I2 is introduced to the inverting input of the operational amplifier OP if the transistor Q5 is turned ON while the constant current I3 is introduced to the inverting input of the operational amplifier OP if the transistor Q7 is turned ON.

Next, operation of the D/A converter circuit of FIG. 1 will be described in detail.

If both of the low-order 2 bits are set at '0', both of the transistors Q5 and Q7 are turned OFF, so that the output of the D/A converter 1 is directly provided as the output of the D/A converter circuit. If the fifteenth bit is set at '1', the transistor Q5 is turned ON, so that electrical connection relating to the constant current I2 is provided for the voltage-follower circuit 2. Thus, the constant current I2 flows through the feedback resistor R2, so that the D/A converter circuit produces an analog output voltage of R2×I2. In contrast, if the LSB is set at '1', the transistor Q7 is turned ON. As a result, the D/A converter circuit produces an analog output voltage of R2×I3. If both of the low-order 2 bits are set at '1', the constant currents I2 and I3 are added together, so that the D/A converter circuit produces an analog output voltage which corresponds to the result of addition.

The D/A converter circuit of the present embodiment can produce a half or a quarter of a minimum step voltage ΔV which is outputted from the D/A converter 1. In order to do so, resistance of the feedback resistor R2 and values of the constant currents I2 and I3 are determined to meet conditions defined by equations, as follows:

$$R2 \times I2 = \Delta V/2,$$

and $$R2 \times I3 = \Delta V/4$$

If the minimum step voltage ΔV is set in a milli-volt range, it is possible to reduce resistance of the feedback resistor R2 as well as the values of the constant currents I2 and I3.

As described above, the present embodiment does not require a resistor having high resistance which requires a relatively large area in the IC. In addition, it is possible to reduce resistance of the feedback resistor R2. Further, it is possible to manufacture the current-mirror circuit in a relatively small area. Therefore, if the D/A converter circuit is manufactured as an IC circuit, a large area of the IC circuit is not occupied by the resistor. In short, it is possible to extend a number of bits with ease and without greatly enlarging the size of the D/A converter circuit.

Incidentally, the present embodiment is designed to extend the number of bits by the low-order 2 bits. However, it is possible to increase an extended number of bits by modifying the present embodiment. In other words, it is possible to provide extended 'n' bits for the D/A converter circuit (where 'n' is an integer larger than '1').

Lastly, circuit elements and components, which are employed by the D/A converter circuit of the invention, are not limited to those used by the embodiment of FIG. 1. Hence, any kinds of circuit elements and components can be applied to the invention.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within meets and bounds of the claims, or equivalence of such meets and bounds are therefore intended to be embraced by the claims.

What is claimed is:

1. A digital-to-analog converter circuit, the digital-to-analog converter circuit comprising:

a digital-to-analog converter for receiving data of m bits (where 'm' is an integer arbitrarily selected), wherein the data of m bits are extended by bits $b_H$ and $b_L$ in low-order positions thereof and $b_H$ is placed in a higher order than $b_L$;

a voltage-follower circuit containing an operational amplifier whose noninverting input is connected to an output of the digital-to-analog converter, wherein a feedback resistor is connected between an inverting input and an output of the operational amplifier;

a current-mirror circuit for providing two constant currents $I_H$ and $I_L$ in response to the bits $b_H$ and $b_L$ respectively, wherein a relationship between the constant currents $I_H$ and $I_L$ is defined by an equation of $I_H = 2 \times I_L$; and a current-switching circuit, connected between the current-mirror circuit and the voltage-follower circuit, for selectively providing the two constant currents to the inverting input of the operational amplifier in accordance with values of the bits $b_H$ and $b_L$.

2. A digital-to-analog converter circuit according to claim 1, wherein in the current-mirror circuit, a reference current is subjected to current-mirror operation, using MOS transistors $Q_H$ and $Q_L$, so that the constant currents $I_H$ and $I_L$ are created, wherein the relationship between the constant currents $I_H$ and $I_L$ is set by adjusting measurements of the MOS transistors $Q_H$ and $Q_L$.

3. A digital-to-analog converter circuit according to claim 1, wherein the current-switching circuit is configured by two pairs of MOS transistors, each pair of MOS transistors is connected to the current-mirror circuit, and one of the MOS transistors in each pair is selectively tuned on such that each of the constant current $I_H$ and $I_L$ is selectively provided to the inverting input of the operational amplifier in accordance with a value of each of the bits $b_H$ and $b_L$.

4. A digital-to-analog converter circuit, the digital-to-analog converter circuit comprising:

a digital-to-analog converter for receiving data of m bits which are placed in high orders of input data of (m+n) bits (where 'm' and 'n' are integers arbitrarily selected);

a voltage-follower circuit containing an operational amplifier whose noninverting input is connected to an output of the digital-to-analog converter, wherein a feedback resistor is connected between an inverting input and an output of the operational amplifier;

a current-mirror circuit for providing a plurality of constant currents, a number of which is set at 'n', in response to n bits which are placed in low orders of the input data of (m+n) bits; and a current-switching circuit, connected between the current-mirror circuit and the voltage-follower circuit, for selectively providing the plurality of constant currents to the inverting input of the operational amplifier in accordance with values of the n bits.

5. A digital-to-analog converter circuit, the digital-to-analog converter circuit comprising:

a digital-to-analog converter means for receiving data of m bits which are placed in high orders of input data of (m+n) bits (where 'm' and 'n' are integers arbitrarly selected);

a signal summing means containing an operational amplifier whose noninverting input is connected to an output of the digital-to-analog converter means, wherein a feedback resistor is connected between an inverting input and an output of the operational amplifier;

a current source means for providing a plurality of constant currents, a number of which is set at 'n', in response to n bits which are placed in low orders of the input data of (m+n) bits; and a current-switching means, connected between the current source means and the signal summing means, for selectively providing the plurality of constant currents to the inverting input of the operational amplifier in accordance with values of the n bits.

* * * * *